US006949165B2

(12) United States Patent
Koshimizu

(10) Patent No.: US 6,949,165 B2
(45) Date of Patent: Sep. 27, 2005

(54) PLASMA PROCESSING APPARATUS

(75) Inventor: Chishio Koshimizu, Yamanashi (JP)

(73) Assignee: Tokyo Electron Limited, Tokyo (JP)

(*) Notice: Subject to any disclaimer, the term of this patent is extended or adjusted under 35 U.S.C. 154(b) by 247 days.

(21) Appl. No.: 10/239,506

(22) PCT Filed: Jan. 24, 2002

(86) PCT No.: PCT/JP02/00507

§ 371 (c)(1), (2), (4) Date: Sep. 23, 2002

(65) Prior Publication Data

US 2003/0164142 A1 Sep. 4, 2003

(30) Foreign Application Priority Data

Jan. 25, 2001 (JP) ........................................ 2001/016811

(51) Int. Cl.$^7$ ............................................ H01L 21/306

(52) U.S. Cl. ............................ 156/345.44; 156/345.43; 156/345.47; 156/345.51

(58) Field of Search ........................ 156/345.43, 345.47, 156/345.51; 118/728

(56) References Cited

U.S. PATENT DOCUMENTS 5,534,751 A * 7/1996 Lenz et al. ............. 315/111.71
5,868,848 A 2/1999 Tsukamoto
5,928,528 A 7/1999 Kubota et al.
6,041,734 A * 3/2000 Raoux et al. ............ 118/723 E
6,112,697 A * 9/2000 Sharan et al. ............ 118/723 E
2001/0013504 A1 * 8/2001 Imafuku et al. .............. 216/71

FOREIGN PATENT DOCUMENTS

JP 09283498 A 10/1997

* cited by examiner

*Primary Examiner*—Parviz Hassenzadeh
*Assistant Examiner*—Maureen G. Arancibia
(74) *Attorney, Agent, or Firm*—Finnegan, Henderson, Farabow, Garrett & Dunner, LLP

(57) ABSTRACT

An electrical connection means 45 guides a DC voltage, which is generated in an ion sheath when a plasma is excited, to a first electrode 31 where a substrate W is placed. Hence, the DC voltage is applied to both the upper and lower surfaces of the substrate W, so the two surfaces of the substrate have the same potential. As a result, element breakdown, which occurs when a large potential difference occurs between the two surfaces of the substrate W, can be prevented.

2 Claims, 8 Drawing Sheets

VOLTAGE CHANGE AT POINT a OF FIG.3

VOLTAGE CHANGE AT POINT b OF FIG.3

VOLTAGE CHANGE AT POINT c OF FIG.3

PRIOR ART

VOLTAGE CHANGE AT POINT a OF FIG.11

VOLTAGE CHANGE AT POINT b OF FIG.11

VOLTAGE CHANGE AT POINT c OF FIG.11

PLASMA PROCESSING APPARATUS

BACKGROUND OF THE INVENTION

The present invention relates to a plasma processing apparatus for generating a plasma and performing a predetermined process.

In the manufacture of a semiconductor device and flat panel display, plasma processing apparatuses are often used to perform processes such as formation of an oxide film, crystal growth of a semiconductor layer, etching, and ashing. One of the plasma processing apparatuses is called a parallel-plate plasma processing apparatus. A conventional parallel-plate plasma processing apparatus will be described by way of an example in which it is applied to an etching apparatus.

FIG. 10 includes views showing an arrangement of such an etching apparatus. As shown in FIG. 10(*a*), in this etching apparatus, the interior of a hermetically closeable process vessel 111 forms a process chamber 112. Exhaust ports 113 for evacuating the process chamber 112 to a predetermined vacuum degree are formed in the bottom of the process vessel 111. A gas supply nozzle 114 for supplying a process gas into the process chamber 112 is formed in the side wall of the process vessel 111.

An upper electrode 121 and susceptor 131 which form a pair of parallel-plate electrodes are arranged in the process chamber 112. The upper electrode 121 is connected through a feeder rod 122 to an RF power supply 124 which supplies power for generating a plasma. A matcher 123 is interposed in the feeder rod 122.

The susceptor 131 is connected to an RF power supply 134, which supplies power for applying a bias across the susceptor 131 and upper electrode 121, through a feeder rod 132. A matcher 133 is arranged midway along the feeder rod 132.

An electrostatic chuck 141 is formed on the support surface of the susceptor 131. As shown in FIG. 10(*b*), the electrostatic chuck 141 is formed of two insulating films 141A and 141B and a conductive film 141C sandwiched between them. The conductive film 141C of the electrostatic chuck 141 is connected to a variable DC high-voltage power supply 142 provided outside the process vessel 111. An annular focus ring 143 is formed on the periphery of the support surface of the susceptor 131 so as to surround the electrostatic chuck 141.

FIG. 11 is a circuit diagram of a 3D circuit extending from a plasma bulk P to a bias power supply 134. In FIG. 11, reference symbol C1 denotes a capacitance formed on an ion sheath SH around the plasma bulk P; C2, a capacitance formed in a gate oxide film formed on a wafer W, C3, a capacitance formed in the gap between the wafer W and electrostatic chuck 141; and C4 and C5, capacitances respectively formed in the insulating films 141A and 141B of the electrostatic chuck 141. Reference symbol R denotes a resistance of the wafer W; and W', an element or interconnection formed on the wafer W.

FIG. 12 includes graphs showing voltage changes at the respective portions of the 3D circuit shown in FIG. 11. FIG. 12(*a*) shows a voltage change of the matcher 133 on the power supply 134 side (point a of FIG. 11), FIG. 12(*b*) shows a voltage change of the matcher 133 on the susceptor 131 side (point b of FIG. 11), and FIG. 12(*c*) shows a voltage change of an etching surface (point c of FIG. 11) as the surface of the wafer W.

When a plasma is generated, a difference in mobility between the electrons and ions in the plasma generates a negative DC voltage Vdc on the surface of the ion sheath SH. The value of the DC voltage Vdc changes depending on the process conditions, and can become, e.g., about −700 V. In this case, when the bias RF power supply 134 outputs, e.g., an AC voltage with an amplitude of 750 V as shown in FIG. 12(*a*), the voltage of the etching surface (point c) of the wafer W becomes a voltage obtained by superposing the DC voltage Vdc on the above AC voltage, as shown in FIG. 12(*c*).

However, the voltage of the matcher 133 on the susceptor 131 side (point b) is almost the same as that on the power supply 134 side, as shown in FIG. 12(*b*), and no DC voltage is substantially applied across the matcher 133. Hence, the DC voltage Vdc is mostly applied from the wafer W to the electrostatic chuck 141. The capacitance C2 of the wafer W is sufficiently smaller than the capacitances C4 and C5 of the electrostatic chuck 141. Thus, a considerably high voltage is applied across the wafer W.

In this manner, when a large potential difference occurs between the upper and lower surfaces of the wafer W, the gate oxide film or the like formed on the wafer W is damaged to break the element. This problem arises not only when the plasma processing apparatus is applied to an etching apparatus but also is common in any plasma processing apparatus.

SUMMARY OF THE INVENTION

The present invention has been made to solve the problem described above, and has as its object to decrease the potential difference between the upper and lower surfaces of a substrate such as a wafer W.

In order to achieve the above object, a plasma processing apparatus according to the present invention is characterized by comprising a vessel where a predetermined vacuum degree is to be maintained, a plasma source which generates a plasma in the vessel, a first electrode which is arranged in the vessel and on which a substrate to be processed by the plasma is placed, a focus ring arranged on a periphery of that support surface of the first electrode where the substrate is to be placed, and electrical connection means for guiding to the first electrode a DC voltage which is generated in an ion sheath when the plasma is generated. When the DC voltage which is generated when the plasma is generated is guided to the first electrode, the DC voltage is applied to both the upper and lower surfaces of the substrate. Thus, the two surfaces of the substrate have the same potential.

The plasma source may be formed of, of the first electrode and a second electrode arranged in the vessel to oppose the first electrode, that electrode to which a first power for generating the plasma is supplied. In this case, a so-called parallel-plate plasma processing apparatus is obtained.

The electrical connection means may be formed of a conductive member having one end which is exposed to a space where the plasma is present when the plasma is generated, and the other end which is electrically connected to the first electrode.

In this case, the focus ring may have a through hole through which the space where the plasma is present and the first electrode communicate with each other, and the conductive member may be inserted in the through hole. The apparatus may further comprise an insulator extending to a side surface of the first electrode and made of an insulating material. The insulator may have a through hole through which the space where the plasma is present and the first electrode communicate with each other, and the conductive member may be inserted in the through hole.

One end of the conductive member may be made of a material containing the same material as that of the substrate as a major component. This can suppress contamination in the vessel.

The electrical connection means may be formed of a through hole formed in the focus ring to extend between a first electrode-side surface and a second electrode-side surface thereof, and that region on the first electrode which faces the through hole may be conductive.

That region on the first electrode which faces the through hole formed in the focus ring may be made of a material containing the same material as that contained in the substrate as a major component. This can suppress contamination in the vessel.

The focus ring may be made of a conductor, and the electrical connection means may be formed by electrical connection of the focus ring and first electrode.

A filter for adjusting a transmission amount of the DC voltage may be interposed between the focus ring and the first electrode. The DC voltage applied to the focus ring can be adjusted to a desired value by adjusting the filter, and can be applied to the lower surface of the substrate.

The apparatus may further comprise a power supply for supplying a second power to the first electrode, and the filter may have a function of adjusting a passing phase of the second power so a phase of the second power at the substrate and that at the focus ring coincide with each other. Hence, a uniform bias can be applied to the entire region between the first and second electrodes.

DETAILED DESCRIPTION OF THE EMBODIMENTS

The embodiments of the present invention will be described in detail with reference to the accompanying drawings. A description will be made by way of examples in which a plasma apparatus according to the present invention is applied to etching apparatuses.

(First Embodiment)

Figure 1A:
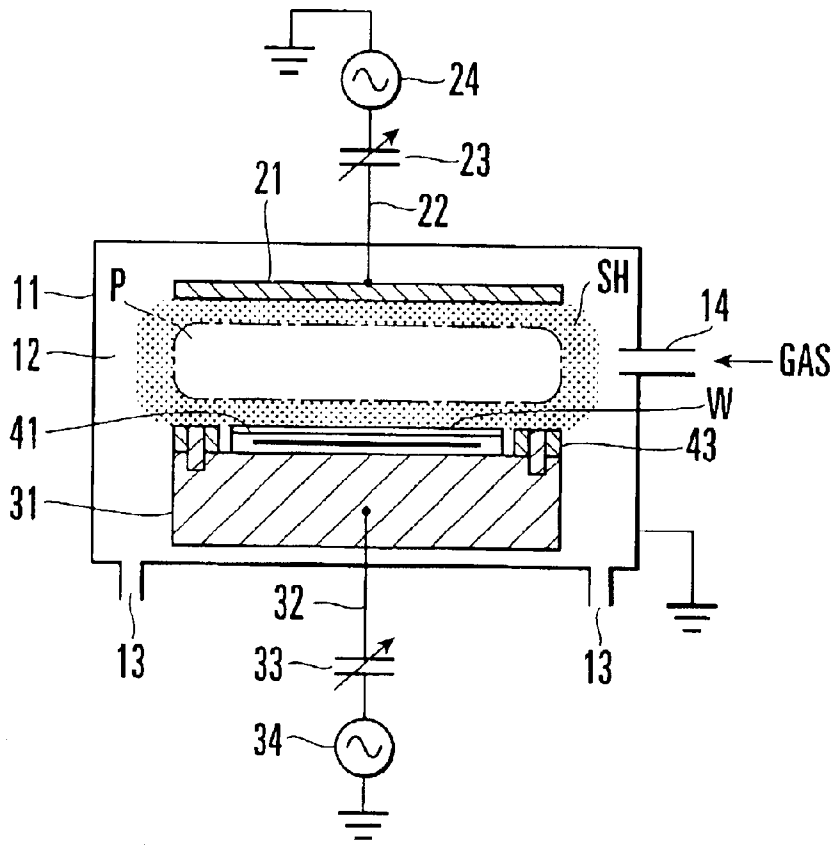
FIGS. 1A and 1B include diagrams showing the arrangement of an etching apparatus according to the first embodiment of the present invention.
Figure 1B:
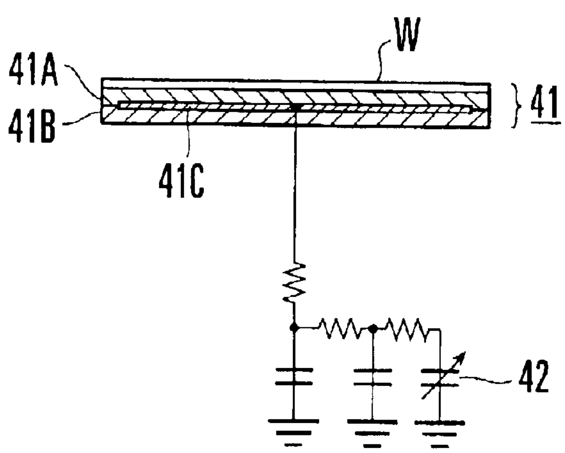
Figure 2:
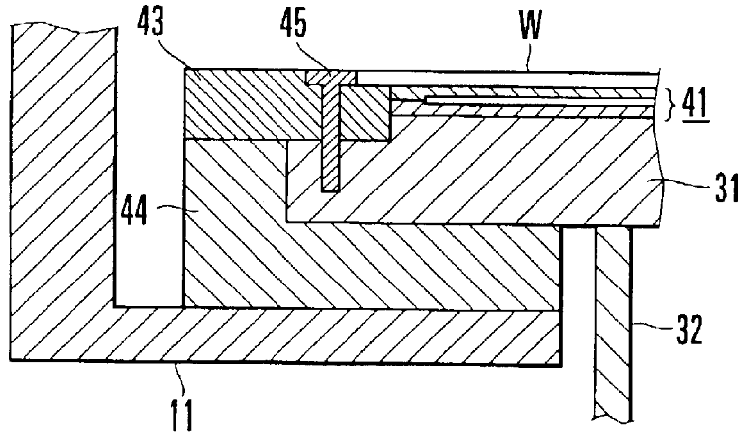
FIG. 2 is an enlarged sectional view showing the arrangement of part of the etching apparatus shown in FIG. 1.

FIG. 1 includes diagrams showing the arrangement of an etching apparatus according to the first embodiment of the present invention. FIG. 2 is an enlarged sectional view showing the arrangement of part of the etching apparatus.

As shown in FIG. 1(*a*), in this etching apparatus, the interior of a hermetically closeable cylindrical process vessel 11 forms a process chamber 12. The process chamber 12 is made of a conductive material such as aluminum, and is grounded. Exhaust ports 13 communicating with a vacuum pump (not shown) are formed in the bottom of the process vessel 11, and can evacuate the interior of the process vessel 11 to a predetermined vacuum degree. A gas supply nozzle 14 for supplying process gases such as Ar, $O_2$, $C_4H_8$, and the like into the process chamber 12 is formed in the side wall of the process vessel 11.

A susceptor 31 and upper electrode 21 respectively serving as the first and second electrodes that form a pair of parallel-plate electrodes are arranged in the process chamber 12 to oppose each other. The susceptor 31 and upper electrode 21 are made of, e.g., aluminum.

The upper electrode 21 is connected to an RF power supply 24 through a feeder rod 22. The RF power supply 24 supplies the first power for generating a plasma in the process chamber 12, and suffices as far as it outputs a power with a frequency of 10 MHz or more and a power value of about several kW. Assume that the RF power supply 24 outputs a power with a frequency of 60 MHz and a power value of 2 kW. A matcher 23 for matching the impedances of the RF power supply 24 and upper electrode 21 is arranged midway along the feeder rod 22.

The susceptor 31 is connected to an RF power supply 34 through a feeder rod 32. The RF power supply 34 supplies a second power for applying a bias between the susceptor 31 and upper electrode 21. The second power suffices as far as it has a frequency substantially lower than that of the plasma-exciting first power and a power value of about several kW. Assume that the second power has a frequency of 2 MHz and a power value of 1.5 kW. A matcher 33 for matching the impedances of the RF power supply 34 and susceptor 31 is arranged midway along the feeder rod 32. The matchers 23 and 33 are comprised of, e.g., variable capacitors.

As shown in FIG. 2, the susceptor 31 is fixed to the bottom of the process vessel 11 through an insulator 44 made of an insulating material such as a ceramic material. When the insulator 44 extends to the side portion of the susceptor 31, that space on the side of the susceptor 31 where a plasma can be present becomes small. Thus, the plasma can be efficiently generated in the space between the upper electrode 21 and susceptor 31.

An electrostatic chuck 41 is formed on the support surface of the susceptor 31. As shown in FIG. 1(*b*), the electrostatic chuck 41 is formed of, e.g., two polymeric polyimide films 41A and 41B and a conductive film 41C, e.g., a copper foil, sandwiched between them in an insulated state. The conductive film 41C of the electrostatic chuck 41 is connected to a variable DC high-voltage power supply 42 provided outside the process vessel 11. When the power supply 42 applies a high voltage to the conductive film 41C, a wafer (substrate) W can be attracted to and held by the upper surface of the electrostatic chuck 41 with an electrostatic force.

As shown in FIG. 2, an annular focus ring 43 is arranged on the periphery of the support surface of the susceptor 31 so as to surround the electrostatic chuck 41. The focus ring 43 is formed such that when the wafer W is placed, the upper surface of the wafer W is flush with the upper surface of the focus ring 43. The plasma tends to concentrate at the edge of the wafer W. Concentration of the plasma at the edge of the wafer W is suppressed when regarding the focus ring 43 as the wafer W, so the plasma can be distributed more uniformly over the entire range of the wafer W. The focus ring 43 is made of a material containing the same material as that of the wafer W as a major component, so it will not contaminate the interior of the process chamber 12. For example, when the wafer W is an Si wafer, the focus ring 43 is made of Si, $SiO_2$, or the like. Whether the focus ring 43 is conductive or not does not matter.

The focus ring 43 has screw holes (through holes) extending between its upper and lower surfaces, and screw holes at those positions on the susceptor 31 which correspond to these screw holes. When screws (conductive members) 45 are inserted in these screw holes, the focus ring 43 is fixed to the susceptor 31.

Regarding the screws 45, they also must be made of a material that does not contaminate the interior of the process chamber 12, in the same manner as the focus ring 43. Accordingly, when the wafer W is an Si wafer, a conductive material obtained by doping Si is used as the material of the screws 45. Alternatively, metal screws with surfaces covered with Si may be used. It suffices at least each screw head (one end of each screw 45) which is to come into contact with the plasma is made of a material containing the same material as that of the wafer W as a major component.

The operation of the etching apparatus shown in FIGS. 1 and 2 will be briefly explained.

First, with the wafer W being fixed on the electrostatic chuck 41, the interior of the process chamber 12 is set to a vacuum degree of about 2.7 Pa. While maintaining this vacuum degree, Ar, $O_2$, and $C_4F_8$ are introduced from the gas supply nozzle 14 into the process chamber 12 at flow rates of 400 sccm, 10 sccm, and 8 sccm, respectively.

In this state, the plasma-exciting RF power supply 24 supplies a power with a frequency of 60 MHz and a power value of 2 kW to the upper electrode 21. Then, electric discharge occurs in the space between the upper electrode 21 and susceptor 31. This electric discharge ionizes Ar and $O_2$ to generate a plasma.

Then, the bias power supply 34 supplies a power (voltage amplitude: 750 V) with a frequency of 2 MHz and a power value of 1.5 kW to the susceptor 31 to apply a bias between the upper electrode 21 and susceptor 31. This can etch the wafer W while controlling the energy and anisotropy of the plasma.

Since the potentials of the susceptor 31 and upper electrode 21 are lower than that of a plasma bulk P, the susceptor 31 and upper electrode 21 serve to attract ions in the plasma bulk P, thus separating electrons from it. As a result, an ion layer accompanying an electric field is formed around the plasma bulk P. This layer is called an ion sheath SH. At this time, a DC voltage Vdc of about −700 V is generated on the surface of the ion sheath SH.

Figure 3:
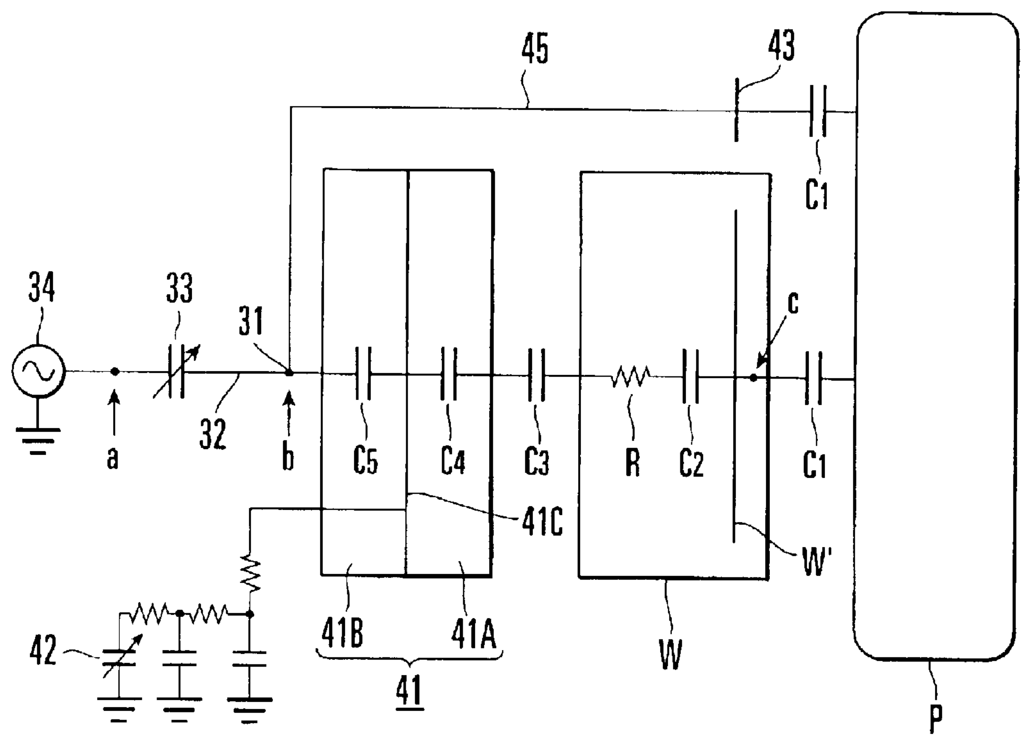
FIG. 3 is a circuit diagram of a 3D circuit extending from a plasma bulk to a bias power supply.
Figure 11:
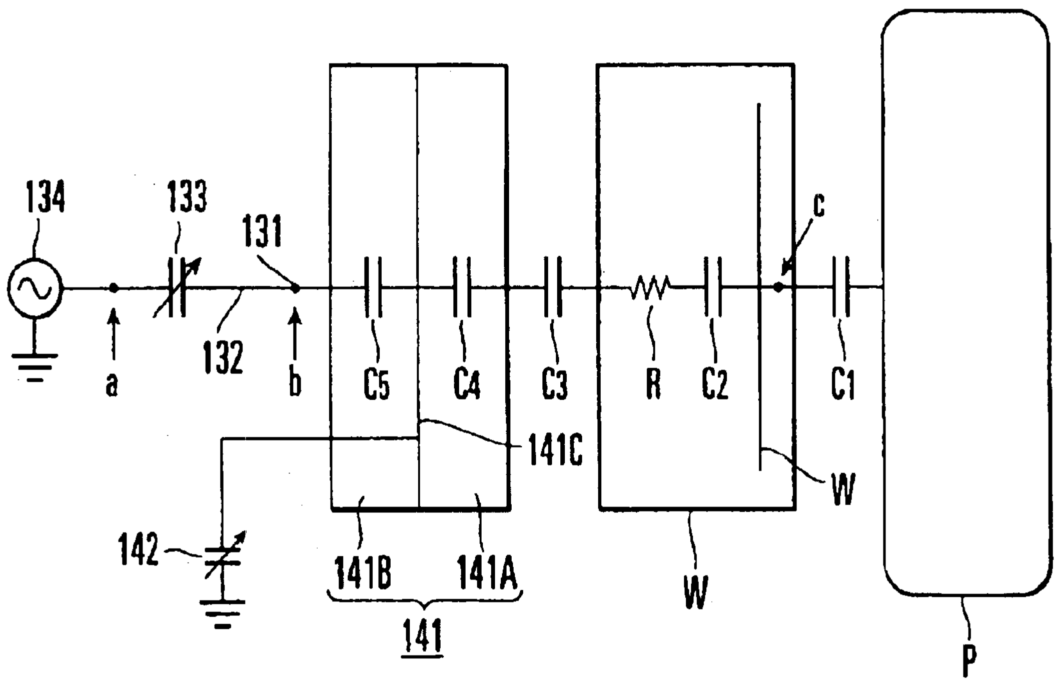
FIG. 11 is a circuit diagram of a 3D circuit extending from a plasma bulk to a bias power supply.
Figure 12A:
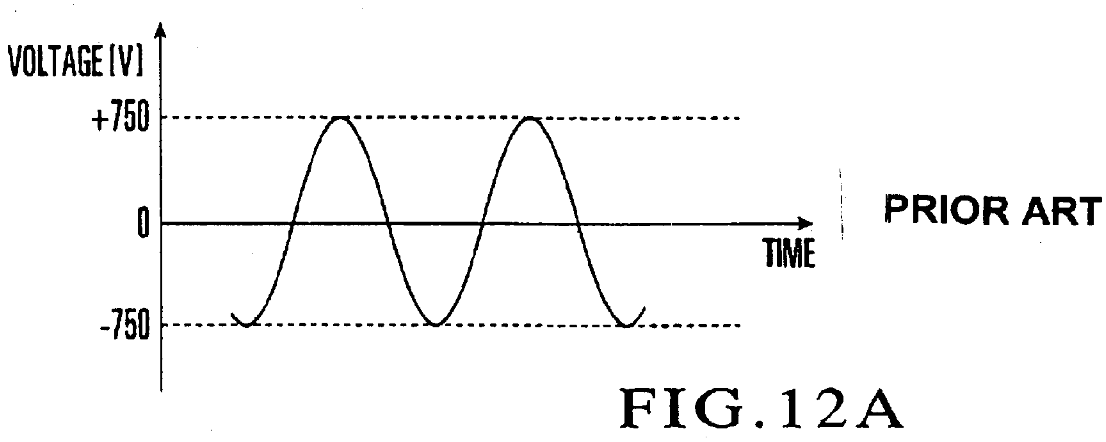
FIGS. 12A, 12B, and 12C include graphs showing voltage changes at the respective portions of the 3D circuit shown in FIG. 11.
Figure 12B:
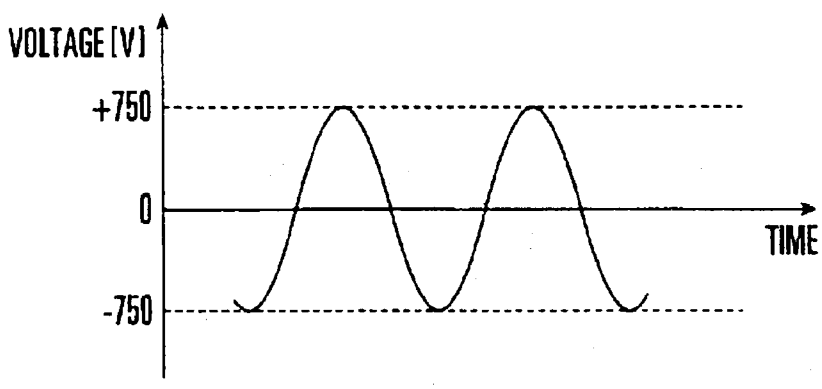
Figure 12C:
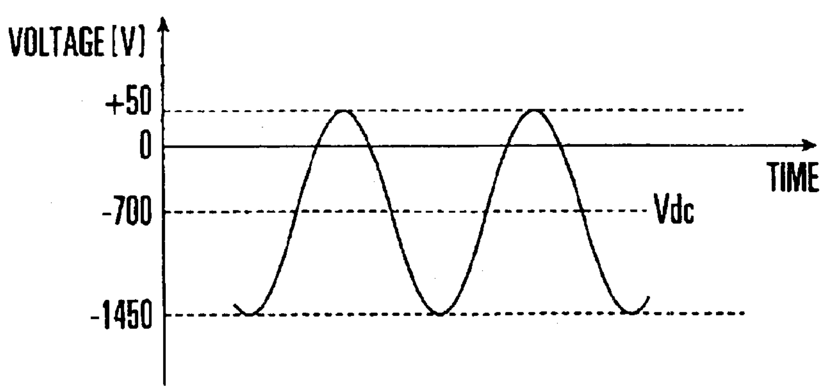

FIG. 3 is a circuit diagram of a 3D circuit extending from the plasma bulk P to the bias power supply 34. In FIG. 3, portions corresponding to those of FIG. 11 are denoted by the same reference numerals as in FIG. 11. FIG. 3 is different from FIG. 11 in that it has an electrical connection means for guiding the DC voltage Vdc to the susceptor 31. This electrical connection means is formed of the screws 45 which fix the focus ring 43 to the susceptor 31. One end of each screw 45 is exposed to a space where a plasma is present when the plasma is generated, and the other end thereof is electrically connected to the susceptor 31. Hence, the DC voltage Vdc is supplied to the susceptor 32 through the screws 45.

Figure 4A:
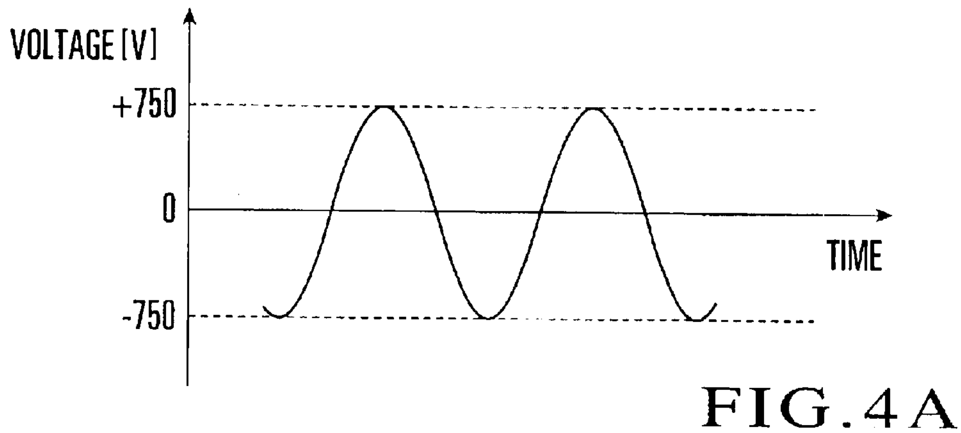
FIGS. 4A, 4B, and 4C include graphs showing voltage changes at the respective portions of the 3D circuit shown in FIG. 3.
Figure 4B:
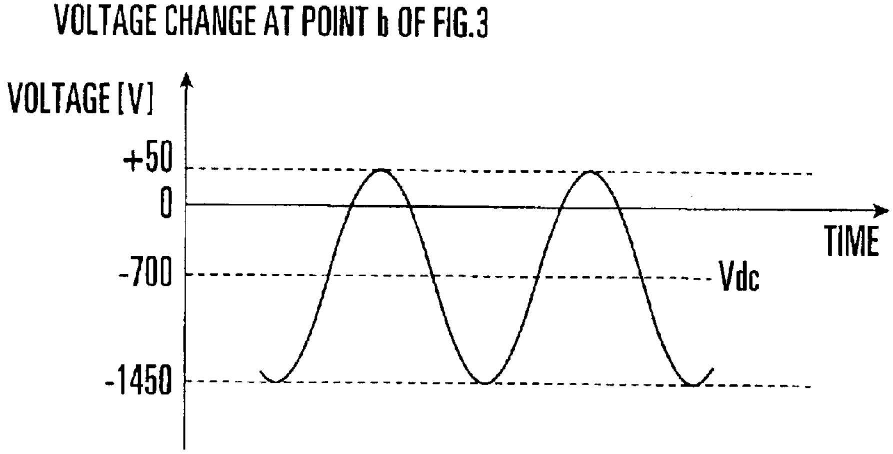
Figure 4C:
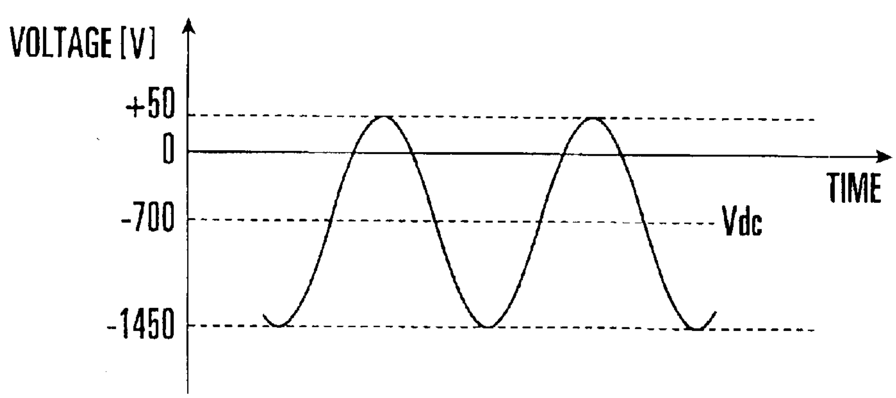

FIG. 4 includes graphs showing voltage changes at the respective portions of the 3D circuit shown in FIG. 4. FIG. 4(*a*) shows a voltage change of the matcher 33 at the RF power supply 34 side (point a of FIG. 3), FIG. 4(*b*) shows a voltage change of the matcher 33 at the susceptor 31 side (point b of FIG. 3), and FIG. 4(*c*) shows a voltage change of the etching surface (point c of FIG. 3) as the upper surface of the wafer W.

As described above, when the plasma is generated, the DC voltage Vdc of about −700 V is generated. The DC voltage Vdc is applied to the etching surface of the wafer W (FIG. 4(*c*)) as well as to the susceptor 32 through the screw 45 (FIG. 4(*b*)). Then, the etching surface and lower surface of the wafer W have the same potential, so element breakdown caused by a large potential difference between the two surfaces can be prevented.

In the etching apparatus shown in FIG. 1, the first power for plasma excitation is supplied to the upper electrode 21, while the second power for bias is supplied to the susceptor 32. Conversely, the first power for plasma excitation may be supplied to the susceptor 32, while the second power for bias may be supplied to the upper electrode 21.

(Second Embodiment)

Figure 5:
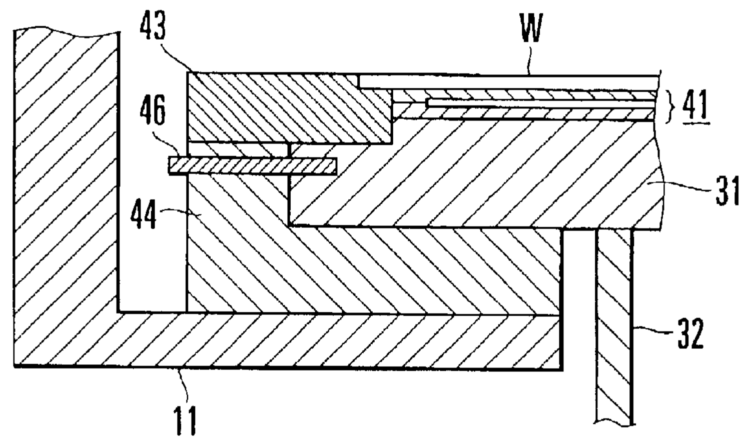
FIG. 5 is an enlarged sectional view showing the arrangement of part of an etching apparatus according to the second embodiment of the present invention.

FIG. 5 is an enlarged sectional view showing the arrangement of part of an etching apparatus according to the second embodiment of the present invention. FIG. 5 corresponds to FIG. 2 of the first embodiment. In FIG. 5, the same or identical portions as in FIG. 2 are denoted by the same reference numerals.

An insulator 44 has a through hole extending between its outer and inner surfaces, and a susceptor 31 also has a hole at that position of its side surface which corresponds to this through hole. A conductive wire (conductive member) 46 is inserted in these holes, and its one end is exposed to the outside of the insulator 44, while its other end is electrically connected to the susceptor 31. This conductive wire 46 is also formed by considering contamination prevention of the interior of the process chamber 12, in the same manner as the screws 45 shown in FIG. 2.

In this etching apparatus, an electrical connection means for guiding a DC voltage Vdc to the susceptor 31 is formed of the conductive wire 46 inserted in the holes of the insulator 44 and susceptor 31. A plasma generated between an upper electrode 21 and the susceptor 31 is diffused in a process chamber 12, so it is present also in a region along the outer surface of the insulator 44. The plasma of this region supplies the DC voltage Vdc to the susceptor 31 through the conductive wire 46. Hence, the upper and lower surfaces of a wafer W have the same potential, so breakdown of an element formed on the wafer W can be prevented, in the same manner as in the etching apparatus shown in FIGS. 1 and 2.

(Third Embodiment)

Figure 6:
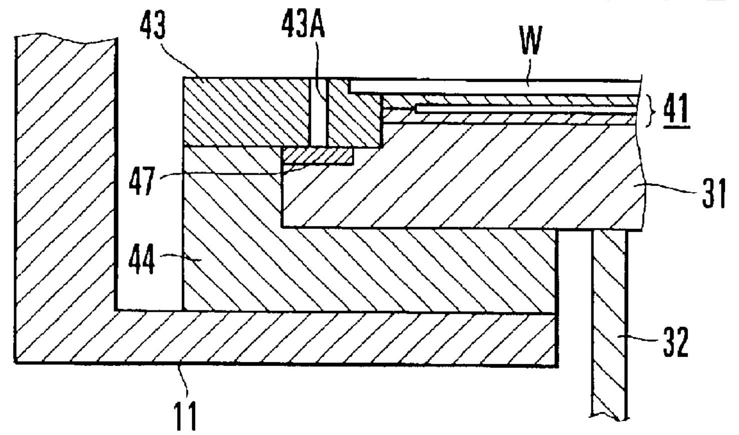
FIG. 6 is an enlarged sectional view showing the arrangement of part of an etching apparatus according to the third embodiment of the present invention.

FIG. 6 is an enlarged sectional view showing the arrangement of part of an etching apparatus according to the third embodiment of the present invention. FIG. 6 corresponds to FIG. 2 of the first embodiment. In FIG. 6, the same or identical portions as in FIG. 2 are denoted by the same reference numerals.

A focus ring 43 has a through hole 43A extending between its upper and lower surfaces. In this etching apparatus, an electrical connection means for guiding a DC voltage Vdc to a susceptor 31 is formed of the through hole 43A. A plasma generated between an upper electrode 21 and the susceptor 31 enters the through hole 43A to come into contact with the support surface of the susceptor 31.

If that region on the support surface with which the plasma has come into contact is conductive, the DC voltage Vdc can be supplied to the susceptor 31, so the breakdown of an element formed on a wafer W can be prevented, in the same manner as described above. Note that since aluminum that forms the susceptor 31 is easily oxidized by the plasma, a conductive plate 47 that cannot be easily oxidized by the plasma is arranged on that region on the support surface which faces the through hole 43A. At this time, considering contamination prevention of the interior of a process chamber 12, the conductive plate 47 must be made of a material containing the same material as that of the wafer W as a major component. For example, when the wafer W is an Si wafer, a conductive material obtained by doping Si can be used as the material of the conductive plate 47.

(Fourth Embodiment)

Figure 7:
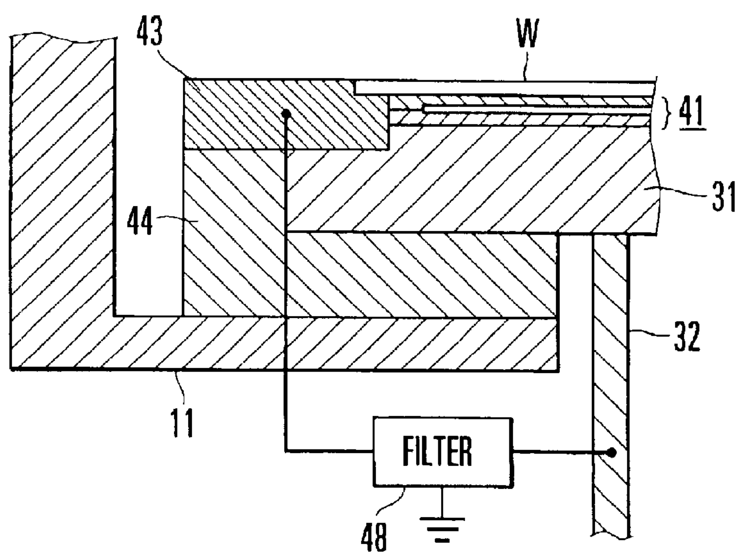
FIG. 7 is an enlarged sectional view showing the arrangement of part of an etching apparatus according to the fourth embodiment of the present invention.

FIG. 7 is an enlarged sectional view showing the arrangement of part of an etching apparatus according to the fourth embodiment of the present invention. FIG. 7 corresponds to FIG. 2 of the first embodiment. In FIG. 7, the same or identical portions as in FIG. 2 are denoted by the same reference numerals.

A focus ring 43 is made of a conductor. For example, when a wafer W is an Si wafer, a conductive material obtained by doping Si is used as the material of the focus ring 43. The focus ring 43 is connected to a feeder rod 32 through a filter 48. The filter 48 adjusts the transmission amount of the DC voltage. In this etching apparatus, an electrical connection means for guiding a DC voltage Vdc to a susceptor 31 is formed by an electrical connection of the focus ring 43, filter 48, and feeder rod 32. The value of the DC voltage Vdc applied to the focus ring 43 can be adjusted to a desired value by adjusting the filter 48, and can be supplied to the lower surface of the wafer W.

For example, when the plasma distribution on the susceptor 31 is nonuniform, a DC voltage Vdcf generated on the focus ring 43 sometimes has an absolute value larger than that of a DC voltage Vdcw generated on the wafer W. In this case, the transmission amount of the filter 48 is adjusted, so Vdcf is attenuated to become equal to Vdcw and is then supplied to the feeder rod 32. Then, the etching surface and lower surface of the wafer W have the same potential, so element breakdown caused when a large potential difference occurs between the two surfaces can be prevented.

The filter 48 has a function of adjusting the passing phase of the bias second power. When the transmission characteristics against the DC voltage are changed, the passing phase of the second power changes, so the phase of the second power becomes different between the wafer W and focus ring 43. In this case, a potential difference occurs between on the wafer W and on the focus ring 43, and a uniform bias cannot be applied to the entire region on the susceptor 31. When, however, the passing phase of the second power is adjusted by using the above-described function of the filter 48 so the phase of the second power at the wafer W and that at the focus ring 43 coincide with each other, a uniform bias can be applied to the entire region on the susceptor 31.

The transmission characteristics and phase characteristics of the filter 48 are preferably variable so they can be adjusted to optimal values in accordance with alternation in process conditions and the like.

Figure 8:
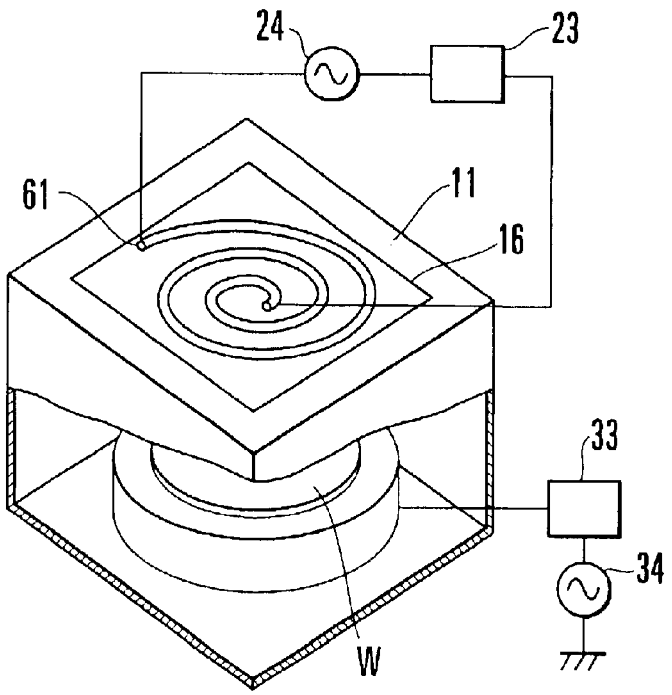
FIG. 8 is a cutaway view showing the arrangement of an inductive coupling plasma etching apparatus that can be applied to the present invention.
Figure 9:
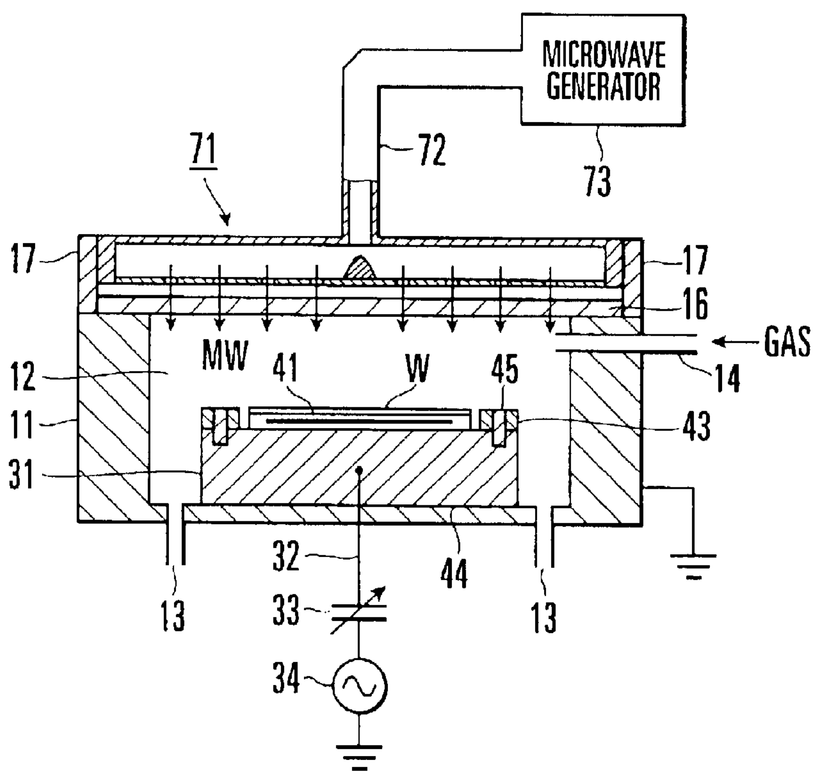
FIG. 9 is a sectional view showing the arrangement of a microwave etching apparatus that can be applied to the present invention.
Figure 10A:
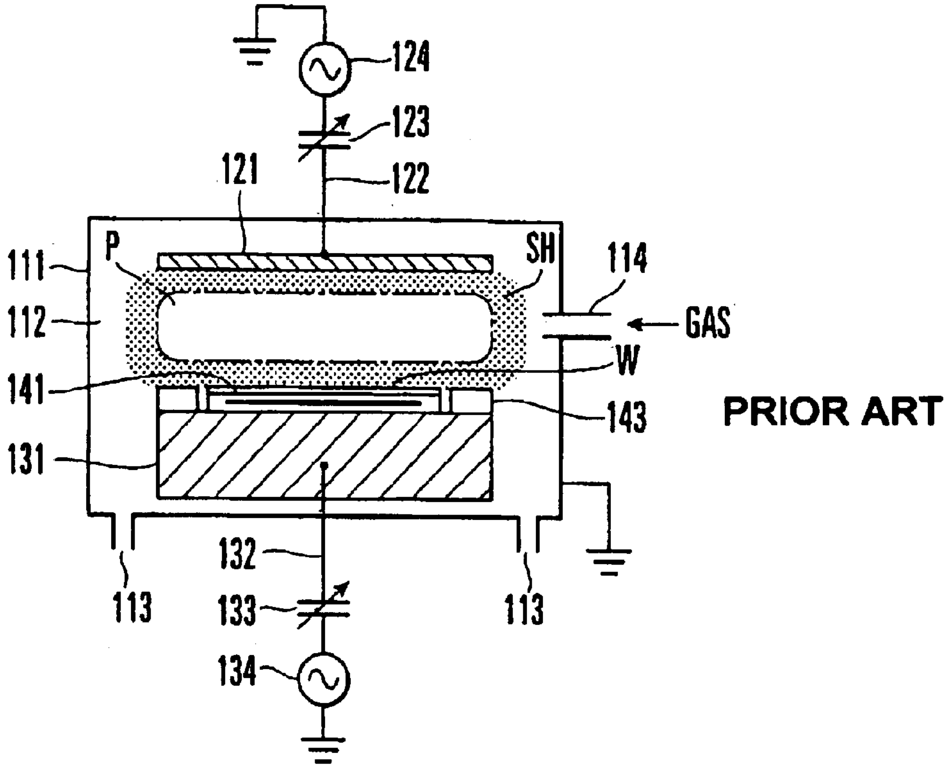
FIGS. 10A and 10B include diagrams showing an arrangement of a case in which a conventional plasma processing apparatus is applied to an etching apparatus.
Figure 10B:
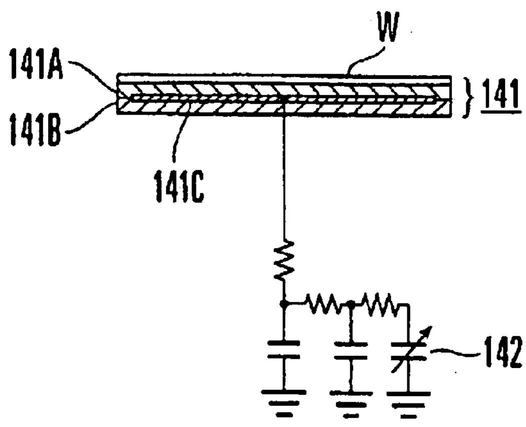

The explanation has been made by way of a parallel-plate etching apparatus in which one of parallel-plate electrodes, to which the first power for generating a plasma is supplied, serves as a plasma source. The present invention can also be applied to etching apparatuses using other plasma sources, such as an inductive coupling plasma etching apparatus (ICP etching apparatus) having as a plasma source a coil 61 to which the first power is supplied, as shown in FIG. 8, or a microwave etching apparatus having as a plasma source an antenna, e.g., a radial antenna 71, which supplies a microwave MW into a process chamber 12, as shown in FIG. 9. In FIGS. 8 and 9, the same or identical portions as in FIGS. 1 and 2 are denoted by the same reference numerals as in FIGS. 1 and 2. Reference numeral 16 denotes a dielectric window; 17, a shield member for preventing leakage of the microwave MW; 72, a waveguide; and 73, a microwave generator.

The present invention can be applied not only to an etching apparatus but also to a plasma CVD apparatus, an ashing apparatus, and any other plasma processing apparatus.

What is claimed is:

1. A plasma processing apparatus, comprising:

a vessel where a predetermined vacuum degree is to be maintained;

a plasma source which generates a plasma in said vessel;

a first electrode which is arranged in said vessel and on which a substrate to be processed by the plasma is placed;

a focus ring arranged on a periphery of said first electrode;

electrical connection means for guiding to said first electrode a DC voltage which is generated in an ion sheath when the plasma is generated; and an adjustable filter connected between said focus ring and said first electrode and serving to adjust a transmission amount of the DC voltage, wherein said focus ring is made of a conductor, wherein said electrical connection means is formed by electrical connection of said focus ring and first electrode.

2. A plasma processing apparatus according to claim 1, wherein the apparatus further comprises a power supply for supplying a power to said first electrode, and said filter adjusts a passing phase of the power so a phase at the power of the substrate and that at said focus ring coincide with each other.

* * * * *